United States Patent
Jodka et al.

(10) Patent No.: US 11,804,769 B2
(45) Date of Patent: Oct. 31, 2023

(54) POWER CONVERTER CONTROL

(71) Applicant: TEXAS INSTRUMENTS INCORPORATED, Dallas, TX (US)

(72) Inventors: Eduardas Jodka, Freising (DE); Gaetano Maria Walter Petrina, Mauern (DE); Manuel Wiersch, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 291 days.

(21) Appl. No.: 17/138,603

(22) Filed: Dec. 30, 2020

(65) Prior Publication Data

US 2022/0209654 A1 Jun. 30, 2022

(51) Int. Cl.
H02M 1/08 (2006.01)
H02M 1/44 (2007.01)
H03K 17/687 (2006.01)
H03K 17/16 (2006.01)

(52) U.S. Cl.
CPC ............. H02M 1/08 (2013.01); H02M 1/44 (2013.01); H03K 17/161 (2013.01); H03K 17/687 (2013.01)

(58) Field of Classification Search
CPC ........... H02M 1/08; H02M 1/44; H02M 3/158
See application file for complete search history.

(56) References Cited

U.S. PATENT DOCUMENTS

| | | | | |
|---|---|---|---|---|
| 10,122,279 | B2 * | 11/2018 | Zhang | H02M 3/1582 |
| 2019/0379289 | A1 * | 12/2019 | Xie | H02M 1/0025 |
| 2020/0266702 | A1 * | 8/2020 | Zhao | H02M 3/1582 |
| 2021/0175804 | A1 * | 6/2021 | Shumkov | H02M 3/1582 |

FOREIGN PATENT DOCUMENTS

CN 107659128 A * 2/2018 .............. H02M 1/08

OTHER PUBLICATIONS

Pandya, T., "Functional Safety FIT Rate, RMD and Pin FMA," SLUAA53—Oct. 2020, pp. 1-8.
Texas Instruments, "EU Declaration of Conformity (DoC)," Mar. 6, 2020, pp. 1-2.
Texas Instruments, "TPS628502EVM-092 Evaluation Module," User's Guide, SLVUBU8—May 2020, pp. 1-11.

* cited by examiner

*Primary Examiner* — Adolf D Berhane
*Assistant Examiner* — Afework S Demisse
(74) *Attorney, Agent, or Firm* — Ray A. King; Frank D. Cimino (57) ABSTRACT

In some examples, an apparatus includes a driver having a driver output, a capacitor having a first plate and a second plate, the first plate coupled to the driver output, and a transistor having a transistor gate, a transistor source, and a transistor drain. The apparatus also includes a first switch coupled between the second plate and the transistor gate, a second switch coupled between the second plate and the transistor drain, and a third switch coupled between the transistor gate and the transistor drain.

20 Claims, 4 Drawing Sheets

POWER CONVERTER CONTROL

BACKGROUND

A switched mode power supply (SNIPS) transfers power from an input power source to a load by switching one or more power transistors or other switching elements coupled through a switch node/terminal to an energy storage element (such as an inductor, an inductance of a transformer, and/or a capacitor), which is capable of coupling to the load. The power transistors can be included in a power converter that includes, or is capable of coupling to, the energy storage element. A SMPS can include a SMPS controller to provide one or more control signals to switch the power transistor(s).

SUMMARY

In some examples, an apparatus includes a driver having a driver output, a capacitor having a first plate and a second plate, the first plate coupled to the driver output, and a transistor having a transistor gate, a transistor source, and a transistor drain. The apparatus also includes a first switch coupled between the second plate and the transistor gate, a second switch coupled between the second plate and the transistor drain, and a third switch coupled between the transistor gate and the transistor drain.

In some examples, a method includes controlling a driver and a first switch to form a first circuit arrangement to charge a capacitor from a power source, controlling a second switch to form a second circuit arrangement to charge a gate capacitance of a transistor from the power source to precharge the transistor, and controlling the driver and a third switch to form a third circuit arrangement that couples a top plate of the capacitor to a gate of the transistor to charge the gate capacitance of the transistor.

In some examples, a system includes a load and a switched mode power supply (SNIPS) configured to switch power from a power source to the load. The SMPS includes a driver having a driver output, a capacitor having a first plate and a second plate, the first plate coupled to the driver output, and a transistor having a transistor gate, a transistor source, and a transistor drain. The SMPS also includes a first switch coupled between the second plate and the transistor gate, a second switch coupled between the second plate and the transistor drain, and a third switch coupled between the transistor gate and the transistor drain.

DETAILED DESCRIPTION

In some device architectures, a switched mode power supply (SMPS) includes, or is capable of coupling to, an output/bulk capacitor in parallel with the load. A SMPS controller switches power transistor(s) to form circuit arrangements with energy storage element(s) to supply a load current to the load and/or to the output/bulk capacitor to maintain a regulated output voltage. Alternatively, though not shown herein, at least some of the power transistors are implemented as passive switches, such as diodes. A power transistor can be coupled through the switch node/terminal to an energy storage inductor during charging and/or discharging switching states of a power converter. In at least some cases, the energy storage inductor is switched by the SMPS controller between charge and discharge switching states to supply inductor current (e.g., current through the energy storage inductor) to the load and to the output/bulk capacitor to maintain the regulated output voltage. As described above, in at least some cases, one or more of the power transistors are replaced by passive switches that react based on characteristics of a received input signal and are not switched by the SMPS controller. In some cases, a SMPS can be configured for operation as a constant current source with an energy storage element but with no output/bulk capacitor. Power converters periodically repeat sequences of switching states (such as "on" and "off" states). A single on/off cycle may be called a switching cycle.

The power transistors can be implemented as field effect transistors (FETs), such as metal-oxide field effect transistors (MOSFETs) or any other suitable solid-state transistor devices (e.g., such as bipolar junction transistors (BJTs)). Power converters can be of various architectures, each having certain functionality, such as buck, boost, and buck-boost (e.g., either inverting or non-inverting), among others. Depending on the application that a buck-boost converter is used in, the input voltage (VIN) and/or the output voltage (VOUT) of the power converter may vary. To address this, the SMPS controller will control the buck-boost converter to operate in different modes of operation. For instance, based on VIN being greater than VOUT, the SMPS controller will cause the power converter to operate in a buck mode of operation. Based on VIN being less than VOUT, the SMPS controller will cause the power converter to operate in a boost mode of operation. Based on VIN being approximately equal to VOUT, the SMPS controller will cause the power converter to operate in a buck-boost mode of operation, or in alternate cycles of buck-mode and boost-mode operation. The above instances are non-exclusive and apply generally to a power converter of buck-boost topology or architecture. However, at least some of the above instances also apply to power converters of other topologies or architectures, such as buck or boost, operating various certain modes of control.

To control a mode of operation of the power converter, the SMPS controller provides gate control signals to one or more power transistors of the power converter. The gate control signals received by a power transistor control whether the power transistor is in a conductive state (e.g., turned on) or in a non-conductive state (e.g., turned off). Each state of a power converter involves a specific combination of transistors that are in conducting states and transistors that are in non-conducting states. To change a mode of operation of the power converter, the SMPS controller modifies the sequence of switching states that it commands the transistors to assume. In at least some cases, the SMPS controller implements a state machine or other logic such that values of the gate control signals are determined based on a mode of operation of or for the power converter. Also, while remaining in a mode of operation of the power converter, the SMPS controller may modify a value of one or more of the gate control signals to alternatively turn on and turn off one or more power transistors.

In some cases, a driver provides the gate control signal to a power transistor based on a control signal, such as a pulse width modulation (PWM) signal, provided by the SMPS controller. To cause the power transistor to become conductive, the gate control signal should have a value greater than a respective threshold voltage (Vth) of the power transistor. In FET transistors, Vth is with respect to a gate-to-source voltage (Vgs) of the power transistor. In at least some cases, it is advantageous to operation of a power converter to implement the power transistors of the power converter as n-type, or n-channel, FETs (NFETs). For instance, a NFET device may have a smaller size, and therefore increased efficiency, such as under light load conditions, than other devices such as p-type, or p-channel, FETs (PFETs). However, implementations that include NFETs can come with challenges. For instance, to cause a NFET to become conductive, the gate control signal with respect to the source should have a value greater than Vth. If the NFET is implemented in such a way as to provide a value substantially equal to VIN at its source terminal, semiconductor physics may dictate that the gate terminal of the NFET must be provided a signal having a value greater than or equal to Vth+VIN to cause the NFET to remain conductive. Thus, semiconductor physics may dictate that a value of the gate control signal may be required to be greater in value than an input voltage of the SMPS. In various cases, the gate control signal is provided through the aid of hardware circuits or components such as charge pumps, bootstrap capacitors, etc. However, to provide performance these circuits or components can often be large in size. For instance, a bootstrap capacitor may consume a large amount of silicon area on a semiconductor die. In at least some cases, the bootstrap capacitor may consume approximately as much surface area as a NFET for which the bootstrap capacitor aids in providing the gate control signal.

Also, a NFET which receives a gate control signal aided by a bootstrap capacitor may become conductive rapidly. This rapid increase in conductivity may result in a rapid flow of current through the NFET to a switch terminal or node of the power converter. However, parasitic elements in the SMPS can create a resonant effect, such as a parasitic LC tank. The LC tank may cause high-frequency ringing at the switch terminal that results in the emission of electromagnetic interference (EMI) and a reduction in efficiency and reliability of the power converter. The parasitic elements may be inherent to construction of components of the SNIPS. For instance, FETs of the SMPS may have junction capacitances, metal traces, wirebonds, leads, or other conductive interconnects (such as coupling a pad of a silicon die and a terminal that electrically exposes that pad to the outside world as a terminal of a device package that encompasses the silicon die) that may have associated resistance, inductance, and/or capacitance. These parasitic elements, rather than characteristics of physical components such as inductors, resistors, or capacitors, may form the LC tank described above.

At least some aspects of this description relate to a circuit and control scheme for controlling a power converter. For example, the circuit and control scheme may provide for a two-stage turn-on process for a high-side NFET of a power converter. The circuit and control scheme may also provide for a bootstrap capacitor having a smaller capacitance and consumed silicon area than a bootstrap capacitor in a circuit not according to the teachings of this description.

In at least some examples, a switch is coupled between an input node at which VIN is provided and the gate terminal of the high-side NFET. Responsive to assertion of a high-side control signal, the switch may be closed to couple the gate terminal of the high-side NFET to the input node, charging the gate of the high-side NFET. Responsive to the voltage provided at the gate terminal with respect to a voltage provided at the source terminal (which may be at or below a ground voltage) of the high-side NFET exceeding Vth, the high-side NFET may begin conducting and a voltage provided at the switch terminal may begin to rise. As the voltage provided at the switch terminal approaches VIN-Vth, the voltage provided at the gate terminal of the high-side NFET will become insufficient to retain the high-side NFET in a conductive, or on, state. A threshold sense circuit may sense a value of the voltage provided at the gate terminal of the high-side NFET and, responsive to the voltage reaching a specified value and the high-side control signal being asserted, control a driver to provide the gate control signal to the gate terminal of the high-side NFET. The gate control signal may be provided to a bottom plate of a bootstrap capacitor having a top plate coupled to the gate terminal of the high-side NFET.

Because the gate terminal of the high-side NFET has been already charged to VIN, the bootstrap capacitor may be smaller in size than in implementations in which the gate terminal of the high-side NFET is not pre-charged to VIN. Based on the gate control signal provided to the gate terminal of the high-side NFET through the bootstrap capacitor, the voltage provided at the gate terminal of the high-side NFET remains greater than Vth+VIN and the high-side NFET remains conductive. In this way, a two-stage turn-on process for the high-side NFET is implemented, where the first stage includes charging the gate terminal of the high-side NFET based on VIN and the second stage includes charging the gate terminal of the high-side NFET based on a bootstrap capacitor. In at least some examples, this two-stage turn-on process results in the bootstrap capacitor consuming a surface area approximately 20 percent to 25 percent less than in circuits that do not include the two-stage turn-on process.

Figure 1:
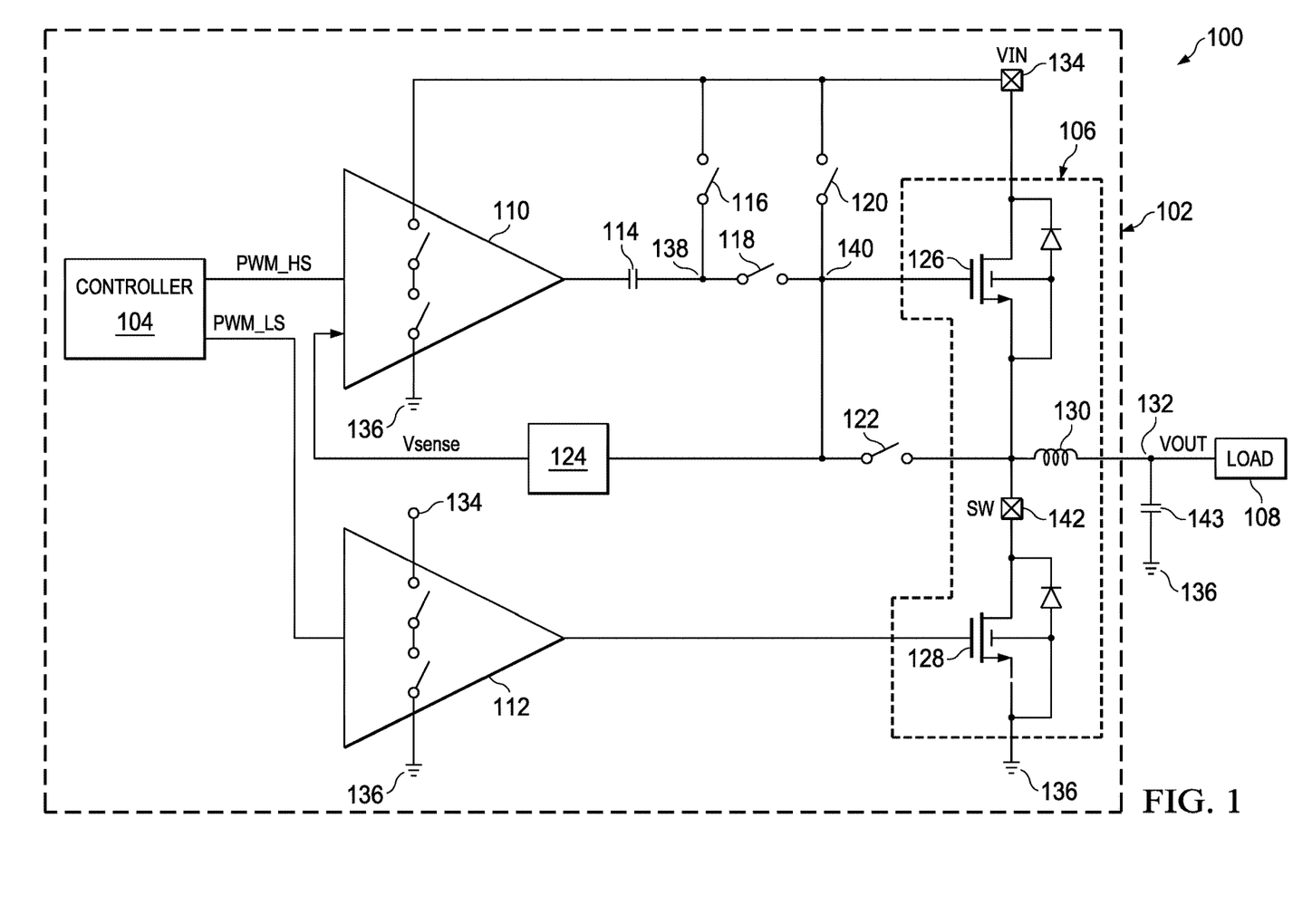
FIG. 1 is a schematic diagram of an example system.

FIG. 1 is a schematic diagram of an example system 100. In at least one example, the system 100 includes a SMPS 102 that includes a controller 104 and a power converter 106. The SMPS 102, at least through the power converter 106, switches power provided to the SMPS 102 as VIN to a load 108 to which the SMPS 102 is adapted to be coupled at a node 132. In some examples, the power converter 106 is a buck power converter. In other examples, although not shown in FIG. 1, the power converter 106 may be a buck-boost power converter that is capable of operating according to a buck mode of operation, a boost mode of operation, and/or a buck-boost mode of operation. In other examples the power converter 106 is a boost power converter. A buck power converter implementation is assumed for description herein. In at least one example, the controller 104 includes any components or circuits suitable for providing a high-side control signal (PWM_HS), and a low-side control signal (PWM_LS) for controlling the power converter 106. In at least some examples the SMPS 102 further includes, or is adapted to be coupled to, a driver 110, a driver 112, a capacitor 114, a switch 116, a switch 118, a switch 120, a switch 122, and a voltage sense circuit 124. Although not shown in FIG. 1, at least some implementations of the controller 104 include one or more of the driver 110, the driver 112, the capacitor 114, the switch 116, the switch 118, the switch 120, the switch 122, and/or the voltage sense circuit 124. The power converter 106 includes a power transistor 126, a power transistor 128, and is adapted to be coupled to an inductor 130. The power converter 106 may be controlled according to any suitable control method, including valley current mode control, peak current mode control, average current mode control, voltage mode control, or any other suitable form of control implemented in a fixed frequency method, variable frequency method, constant time method (e.g., constant Ton or constant Toff), etc.

At least one example of the SMPS 102 includes at least some aspects of the controller 104 and the power converter 106 on a same semiconductor die and/or in a same component package (or encapsulation), while in other examples the controller 104 and the power converter 106 may be fabricated separately and adapted to be coupled together. Accordingly, at least some aspects of the SMPS 102 may be fabricated separately and coupled together. While shown as including the driver 110 and the driver 112, in at least one example the SMPS 102 does not include the driver 110 and the driver 112 and rather is adapted to be coupled to the driver 110 and the driver 112. Similarly, other components shown as being included in the SMPS 102 may be adapted to be coupled, in whole or in part, to the SMPS 102 and not be included on a same semiconductor die and/or in a same component package as the SMPS 102. Similarly, components shown or described in this description as being included in the power converter 106 (such as the inductor 130) may be adapted to be coupled, in whole or in part, to the power converter 106 and not be included on a same semiconductor die and/or in a same component package as the power converter 106.

In at least one example architecture of the system 100, the driver 110 is coupled to a VIN node 134, ground node 136, and has a first input terminal adapted to receive PWM_HS, such as from the controller 104, a second input terminal coupled to an output of the voltage sense circuit 124, and an output terminal. The driver 112 is coupled to the VIN node 134, ground node 136, has a first input terminal adapted to receive PWM_LS, such as from the controller 104, and an output terminal. The capacitor 114 has a bottom plate coupled to the output terminal of the driver 110 and a top plate coupled to a node 138. The switch 116 is coupled between the VIN node 134 and the node 138. The switch 118 is coupled between the node 138 and a node 140. The switch 120 is coupled between the node 140 and the VIN node 134. In at least some examples, the switch 120 includes back-to-back FET transistors (not shown) having gate terminals coupled together. In some examples, the switch 120 may be driven by a driver (not shown). The switch 122 is coupled between the node 140 and a switch node 142. Each of the switch 116, switch 118, and switch 122 may be implemented as FET or other process technology transistors. The voltage sense circuit 124 has an input coupled to the node 140. The power transistor 126 has a gate terminal coupled to the node 140, a drain terminal coupled to the VIN node 134, and a source terminal coupled to the switch node 142. The power transistor 128 has a gate terminal coupled to the output terminal of the driver 112, a drain terminal coupled to the switch node 142, and a source terminal coupled to the ground node 136. The inductor 130 is adapted to be coupled between the switch node 142 and the load 108. In at least some examples, the power converter 106 is adapted to be coupled to a capacitor 143 (e.g., an output capacitor) between the node 132 and the ground node 136. In at least some examples, VOUT is provided at the node 132.

In at least some examples, the VIN node 134 and the ground node 136 are each nodes or pads on a silicon die on which at least some components of the SMPS 102 are implemented. The silicon die may be enclosed in a hosing or package that includes leads or terminals. The VIN node 134 may be coupled to a VIN terminal (not shown) and the ground node 136 may be couple to a ground terminal (not shown). Interconnects, wires, or other conductive material coupling the VIN node 134 to the VIN terminal and the ground node 136 to the ground terminal may introduce parasitic effects into the SMPS 102. As shown in FIG. 1, the power transistor 126 and the power transistor 128 may each have body diodes coupled between their respective drain and source terminals, with associated junction capacitances (not shown). The driver 110 and the driver 112 may each be approximated by FET pull-up and pull-down switches. Responsive to the driver 112 receiving an asserted input signal, the driver 112 may couple the output terminal of the driver 112 to the VIN node 134. Responsive to the driver 112 receiving a deasserted input signal, the driver 112 may couple the output terminal of the driver 112 to the ground node 136. Responsive to the driver 110 receiving PWM_HS having an asserted value and an output signal of the voltage sense circuit 124 (indicated as Vsense) having an asserted value, the driver 110 may couple the output terminal of the driver 110 to the VIN node 134. Responsive to the driver 110 receiving either of PWM_HS or Vsense having a deasserted value, the driver 110 may couple the output terminal of the driver 110 to the ground node 136. In at least some examples, if Vsense is unavailable in the system 100, another signal, such as current sense information of the power converter 106 that may be useful in controlling the power converter 106 may be used in place of Vsense.

In an example of operation of the system 100, the capacitor 114 is charged. To charge the capacitor 114, in at least some examples, the driver 110 is controlled to couple the output terminal of the driver 110 to the ground node 136, the switch 116 is controlled to be closed, electrically coupling the top plate of the capacitor 114 to the VIN node 134. During this time the switches 118, 120, and 122 are controlled to be open. In at least some examples, the capacitor 114 may be charged based on assertion of PWM_LS. Accordingly, in at least some examples the switch 116 may be a normally-open switch controlled based on PWM_LS. Responsive to PWM_HS being asserted, PWM_LS is deasserted, and vice versa. Responsive to PWM_HS being asserted, the switch 120 is controlled to be closed, electrically coupling the gate terminal of the power transistor 126 to the VIN node 134. During this time the switches 116, 118, and 122 are controlled to be open. Accordingly, in at least some examples the switch 120 may be a normally-open switch controlled based on PWM_HS. While the switch 120 is closed, current flows from a voltage source (not shown) coupled to the VIN node 134 to the gate terminal of the power transistor 126. Responsive to the voltage provided at the node 140 increasing to at least Vth greater than the voltage provided at the source terminal of the power transistor 126, the power transistor 126 may begin conducting current from the voltage source coupled to the VIN node 134 to the switch node 142 to cause a voltage provided at the switch node 142 to increase.

The current flowing to the switch node 142 may first seek to charge a junction capacitance (e.g., a capacitance of the parasitic LC tank described above) of the power transistor 128 prior to energizing the inductor 130. As a charge stored by the junction capacitance of the power transistor 128 increases, current will begin to energize the inductor 130. A rate at which current flows to the junction capacitance of the power transistor 128 may determine an approximate capacitance of the junction capacitance of the power transistor 128, where the faster current flows to the junction capacitance of the power transistor 128, the larger the capacitance of the junction capacitance of the power transistor 128 and the more energy stored by the junction capacitance of the power transistor 128. As the amount of energy stored by the junction capacitance of the power transistor 128 increases, an amount of ringing that may occur at the switch node 142, such as via parasitic elements and/or a LC tank as described above, may also increase. By pre-charging the gate terminal of the power transistor 126 through the switch 120 coupling the gate terminal of the power transistor 126 to the VIN node 134, the junction capacitance of the power transistor 128 is charged slowly, as described below in FIG. 2.

As the voltage provided at the switch node 142 increases to approach VIN-Vth, current flowing through the power transistor 126 may decrease. The voltage sense circuit 124 monitors the voltage provided at the node 140 and, responsive to the voltage provided at the node 140 reaching Vth with respect to the voltage provided at the source terminal of the power transistor 126, the voltage sense circuit 124 asserts Vsense. Responsive to assertion of Vsense, and while both Vsense and PWM_HS remain asserted, the driver 110 may couple the output terminal of the driver 110 to the VIN node 134, providing approximately VIN at the output terminal of the driver 110. Thus, while both Vsense and PWM_HS remain asserted, the driver 110 may provide a voltage approximately equal to VIN to the bottom plate of the capacitor 114 such that, if the capacitor 114 has already been charged to a value of approximately VIN as described above, a value of approximately 2*VIN is provided at the top plate of the capacitor 114. In at least some examples, the switch 118 may be a normally-open switch controlled based on Vsense such that switch 118 is closed responsive to assertion of Vsense. In other examples, the switch 118 may be controlled based on a signal provided by a circuit (not shown) that monitors a voltage provided at the top plate of the capacitor 114 and asserts the signal responsive to the voltage provided at the top plate of the capacitor 114 being approximately equal to 2*VIN. While the switch 118 is closed, the top plate of the capacitor 114 is coupled to the node 140 and the gate terminal of the power transistor 126, providing, while PWM_HS is asserted, bootstrapping a voltage of approximately 2*VIN to the gate terminal of the power transistor 126. This bootstrapping maintains a voltage provided to the gate terminal of the power transistor 126 at a value greater than Vth+Vgs, causing the power transistor 126 to remain conductive despite the switch node 142 increasing in value to approximately VIN plus, or minus, any associated noise or electromagnetic interference provided at the switch node 142. In at least some examples, responsive to PWM_HS being deasserted, the switch 122 may be closed before assertion of PWM_LS. Responsive to closing of the switch 122, the value provided at the switch node 142 will decrease to be approximately equal to, or less than, ground and a next switching cycle of the power converter 106 may begin.

Figure 2:
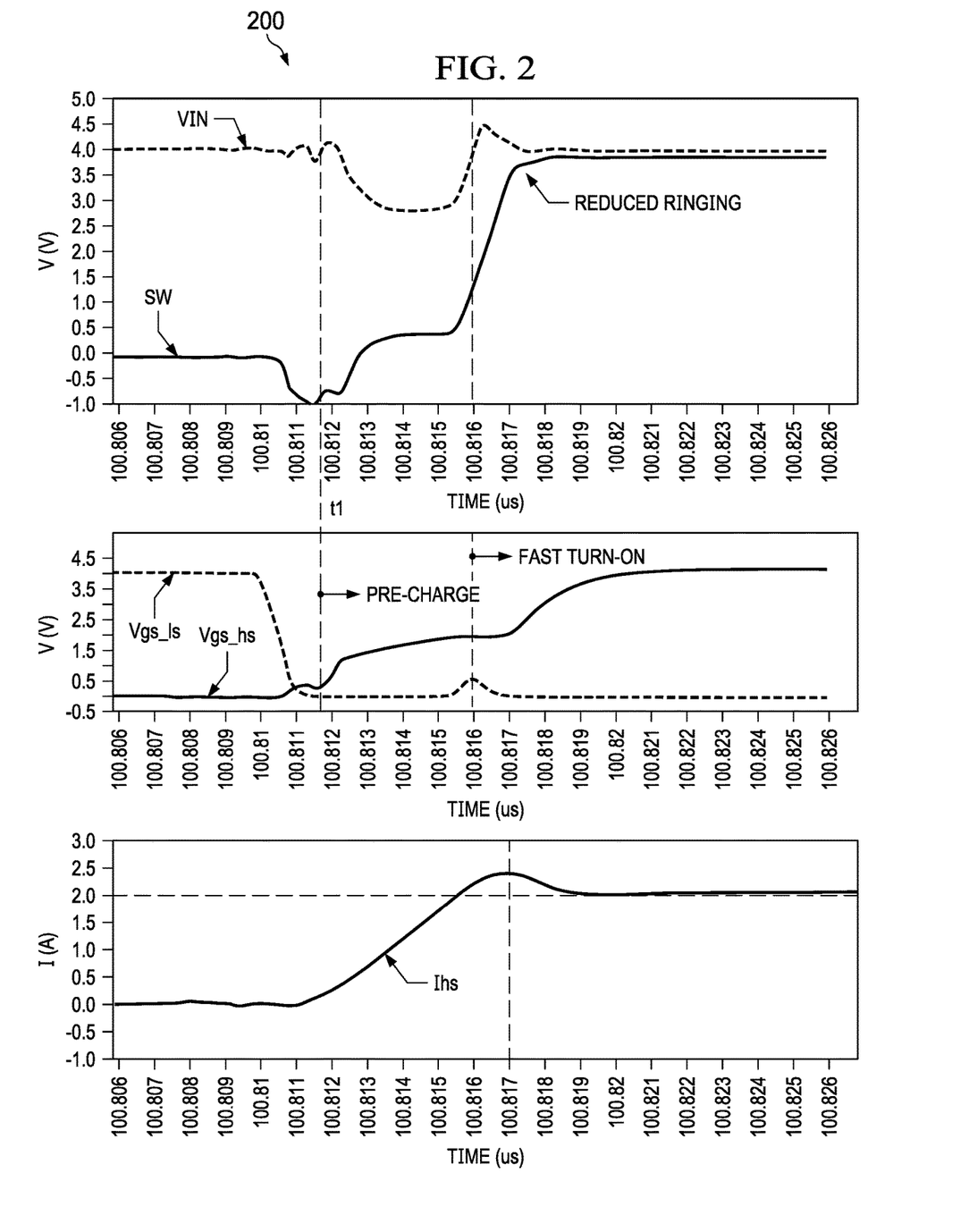
FIG. 2 is a diagram of example signal waveforms.

FIG. 2 is a diagram 200 of example signal waveforms. In at least some examples, the diagram 200 is representative of signals provided in the SMPS 102 of FIG. 1. Accordingly, reference may be made to components or signals of FIG. 1 in describing FIG. 2. The diagram 200 shows VIN, a signal provided at the switch node 142 (indicated in FIG. 2 as SW), Vgs of the power transistor 126 (indicated in FIG. 2 as Vgs_hs), Vgs of the power transistor 128 (indicated in FIG. 2 as Vgs_ls), a current flowing through the power transistor 126 (indicated in FIG. 2 as I_hs). VIN, SW, Vgs_hs, and Vgs_ls are shown on a horizontal axis representing time in units of microseconds (us) and a vertical axis representing voltage in units of volts (V). I_hs is shown on a horizontal axis representing time in units of microseconds (us) and a vertical axis representing voltage in units of amperes (A).

The diagram 200 shows signals of the SMPS 102 in at least one example implementation of the two-stage turn-on process of this description. For example, the diagram 200 shows signals of the SMPS 102 beginning with PWM_LS being asserted and PWM_HS being deasserted, followed by signals of the SMPS 102 responsive to PWM_HS being asserted and PWM_LS being deasserted in which a first stage (e.g., pre-charge stage) of the turn-on process is performed and then a second stage (e.g., fast turn-on stage) of the turn-on process is performed. As shown in the diagram 200, prior to time t1, PWM_LS is asserted causing Vgs_ls to have a value of about 4 V and PWM_HS is deasserted, causing Vgs_hs to have a value of about 0 V. At the time t1, PWM_LS may be deasserted and PWM_HS asserted. In at least some examples, an amount of time may exist in which neither PWM_HS nor PWM_LS is asserted. This time may be referred to as a dead-time. During the dead-time, Vgs_hs is approximately equal to 0 V and Vgs_ls is also approximately equal to 0 V causing current in the inductor 130 to flow through a body diode of the power transistor 128 from its anode (e.g., source of the power transistor 128) to its cathode (e.g., drain of the power transistor 128). Because of this flow of current, a drain-to-source voltage across the power transistor 128 may be approximately a diode voltage (VD), such as about 0.7 V, of the body diode of the power transistor 128, with a positive polarity at the ground node 136 and a negative polarity at the switch node 142. The result is that the voltage provided at the switch node 142 is equal to approximately –VD such that the switch node 142 is negative with respect to ground. Responsive to assertion of PWM_HS, the pre-charge stage of the turn-on process may begin. During the pre-charge stage, the gate terminal of the power transistor 126 is charged by coupling the gate terminal of the power transistor 126 to the VIN node 134 through the switch 120. The rising voltage at the gate terminal of the power transistor 126 causes Vgs_hs to increase, as shown in the diagram 200.

Responsive to Vgs_hs exceeding a Vgs threshold of the power transistor 126 (sometimes about 0.7 V), the power transistor 126 conducts current between its drain and source terminals, as shown by I_hs, causing SW to increase in value from –VD. As SW increases in value parasitic capacitances of the SMPS 102, such as the junction capacitance of the power transistor 128, are charged slowly based on the limited turn-on of, and therefore limited current flow through, the power transistor 126 during the pre-charge stage. Also as SW increases in value, a rate of increase of Vgs_hs and SW slows such that a plateau occurs in values of each of SW and Vgs_hs (sometimes referred to in the context of Vgs_hs as a Miller Plateau). Responsive to assertion by the voltage sense circuit 124 of Vsense, such as based on the value of Vgs_hs, the fast turn-on stage of the turn-on process may begin. The fast turn-on stage may be termed as fast because of the gate terminal of the power transistor 126 being provided a voltage of approximately 2*VIN, or because of a rate of increase of SW during the fast turn-on stage (e.g., correlating to an amount of current flowing through the power transistor 126). Because parasitic capacitances of the SMPS 102 have been charged slowly during the pre-charge stage, ringing in SW is reduced during the fast turn-on stage, reducing EMI emission of the SMPS 102.

Figure 3:
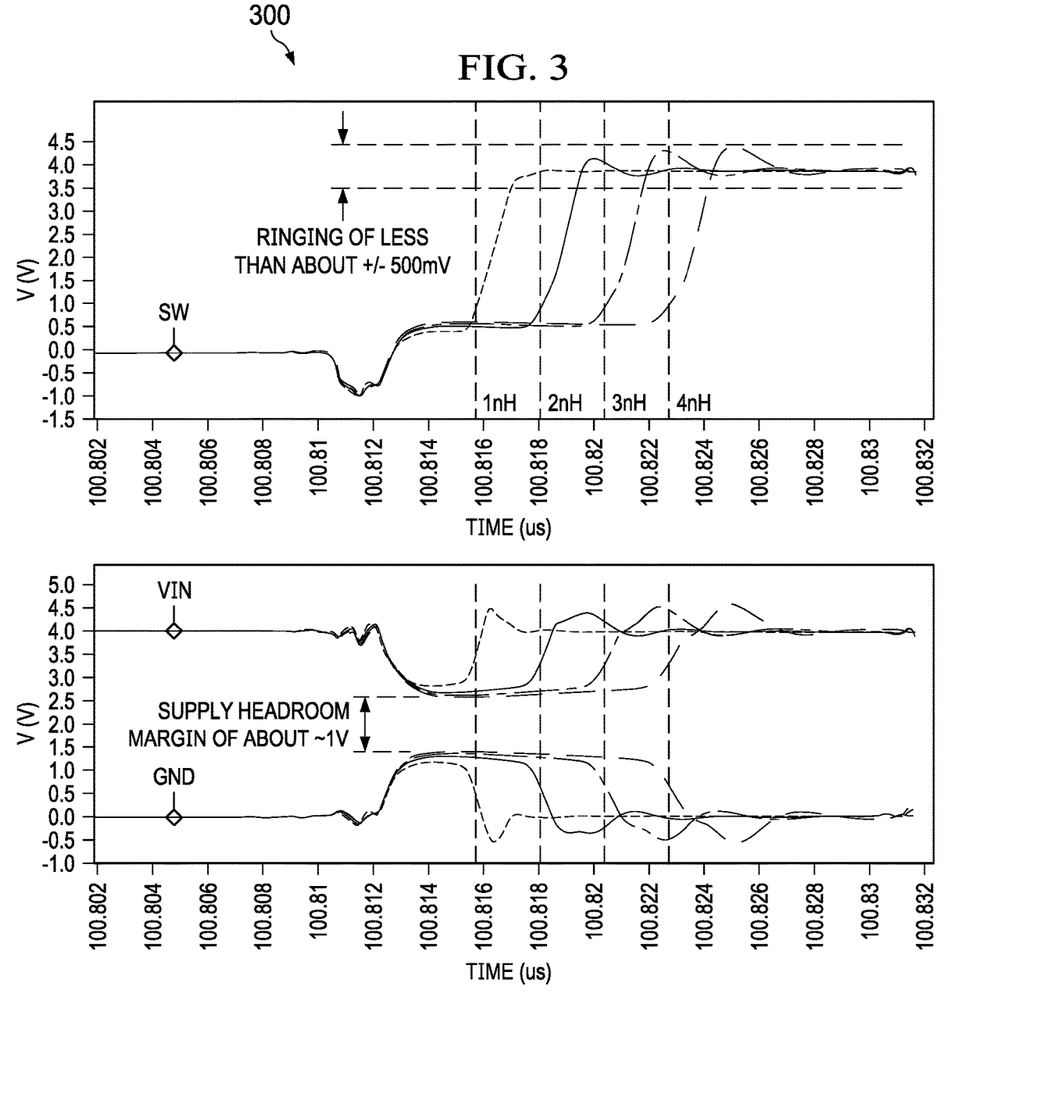
FIG. 3 is a diagram of example signal waveforms.

FIG. 3 is a diagram 300 of example signal waveforms. In at least some examples, the diagram 300 is representative of signals provided in the SMPS 102 of FIG. 1. Accordingly, reference may be made to components or signals of FIG. 1 in describing FIG. 3. The diagram 300 shows a signal provided at the switch node 142 (indicated in FIG. 3 as SW), VIN, and ground (GND). Each signal is shown across multiple SMPS 102 parasitic values, indicated as 1 nanohenries (nH), 2 nH, 3 nH, and 4 nH, each representing parasitic inductances of the SMPS 102. Each signal is shown on a horizontal axis representing time in units of microseconds and a vertical axis representing voltage in units of volts.

As shown by the diagram 300, increases in parasitics, such as parasitic inductance in the SMPS 102, create delays in the SMPS 102. However, while increases in parasitics may increase ringing at the switch node 142, the ringing from up to 4 nH of parasitic inductance may have a value of less than about +/−500 millivolts (mV), which may be an acceptable amount in terms of EMI for many use cases of the SMPS 102. Similarly, collapse in VIN and increases in GND maintain a supply headroom (difference between values of VIN and GND) of at about 1 V or more. In at least some examples, the reduced ringing, as described herein, provides immunity in the SMPS 102 from a value of VIN becoming less than a value of GND. As also shown by the diagram 300, a rising slope of SW is approximately the same across varying parasitic inductances in the SMPS 102 such that efficiency of the SMPS 102 remains approximately the same across these parasitic inductances.

Figure 4:
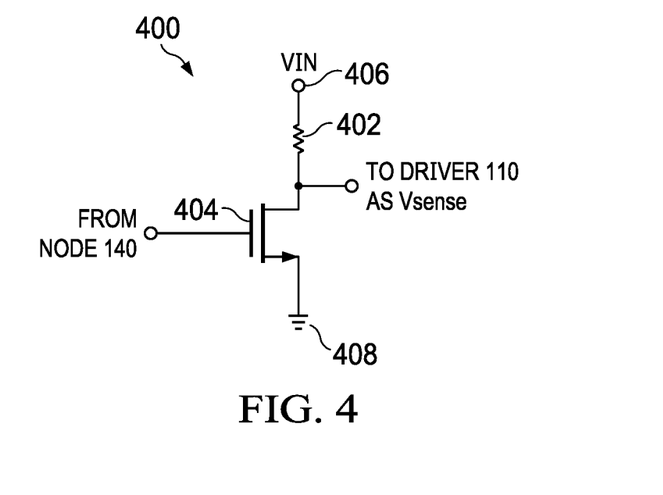
FIG. 4 is a schematic diagram of an example voltage sense circuit.

FIG. 4 is a schematic diagram of an example voltage sense circuit 400. In at least some examples, the voltage sense circuit 400 is suitable for implementation as the voltage sense circuit 124 of FIG. 1. In at least some examples, the voltage sense circuit 400 includes a resistor 402 and a power transistor 404. In other examples, the resistor 402 is replaced by any other suitable load, such as a current source (not shown). In at least some examples, such as responsive to the voltage sense circuit 400 being implemented as the voltage sense circuit 124, the power transistor 404 is a replica of the power transistor 126 of FIG. 2. For example, the power transistor 404 may be a scaled replica of the power transistor 126.

In some implementations, the resistor 402 is adapted to be coupled between a VIN node 406 and a drain terminal of the power transistor 404. A source terminal of the power transistor 404 is adapted to be coupled to a ground node 408. A gate terminal of the power transistor 404 is configured to receive an input signal. In at least some examples, such as when the voltage sense circuit 400 is implemented as the voltage sense circuit 124, the gate terminal of the power transistor 404 is coupled, or adapted to be coupled to, the node 140. Also when the voltage sense circuit 400 is implemented as the voltage sense circuit 124, the voltage sense circuit 400 may be coupled, or adapted to be coupled, to the driver 110 to provide Vsense to the driver 110, as described above. In at least some examples, responsive to a voltage of the input signal provided at the gate terminal of the power transistor 404 exceeding a Vgs threshold of the power transistor 404, the power transistor 404 begins to conduct current. Responsive to the power transistor 404 beginning to conduct current, current flows from a power supply to which the VIN node 406 is adapted to be coupled, through the resistor 402 and the power transistor 404 to the ground node 408. The current flowing through the resistor 402 provides a voltage at the drain terminal of the power transistor 404, which is provided by the voltage sense circuit 400 as an output signal (e.g., Vsense when the voltage sense circuit 400 is implemented as the voltage sense circuit 124) indicating that a value of the input signal has exceeded Vth of the power transistor 404.

Figure 5:
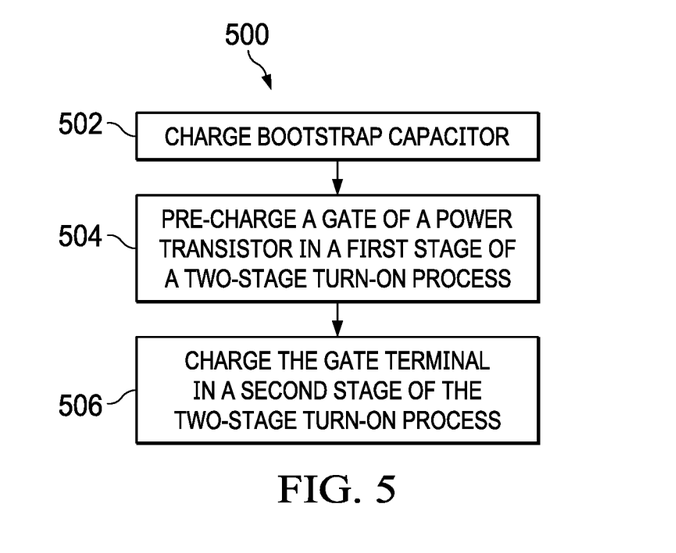
FIG. 5 is a flowchart of an example method.

FIG. 5 is a flowchart of an example method 500. In at least some examples, the method 500 is implemented in a SMPS, such as the SMPS 102 of FIG. 1. The method 500 may provide for a two-stage turn-on process for a power transistor, such as a high-side power transistor of a power converter. In at least some examples, the two-stage turn-on process may reduce ringing at a switch node of the power converter, such as resulting from parasitics of, or associated with, the power converter and/or a component package of the power converter. In at least some examples, the two-stage turn-on process may also, or alternatively, provide for a reduced size of a bootstrap capacitor used in providing a signal to a gate terminal of the power transistor, when compared to that of a turn-on process other than the two-stage turn-on process. In some examples, the reduction in size may be up to about 20% of a silicon surface area of the bootstrap capacitor when compared to that of a turn-on process other than the two-stage turn-on process of this description. In other examples, the reduction in size may be up to about 20-25% of a silicon surface area of the bootstrap capacitor when compared to that of a turn-on process other than the two-stage turn-on process of this description. In yet other examples, the reduction in size may be greater than about 25% of a silicon surface area of the bootstrap capacitor when compared to a turn-on process other than the two-stage turn-on process of this description.

At operation 502, a bootstrap capacitor is charged. In at least some examples, the bootstrap capacitor is charged by controlling circuit components to form circuit arrangements suitable for charging the bootstrap capacitor. For example, a first control signal may be provided to a driver to cause the driver to couple a bottom plate of the bootstrap capacitor to ground. A second control signal may be provided to a switch to cause the switch to couple a top plate of the bootstrap capacitor to a power source to cause charge to transfer from the power source to the bootstrap capacitor. In at least some examples, the switch may be a pair of back-to-back oriented FETs. In some of those examples, a driver may be included that receives the second control signal and provides an output signal based on the second control signal to the FETs. Charging of the bootstrap capacitor may continue until one, or both, of the first and/or second control signals are changed in value, such as at the expiration of a programmed or pre-determined amount of time, or responsive to another signal, condition, or occurrence in the SMPS.

At operation 504, a gate terminal of a power transistor is pre-charged in a first stage of a two-stage turn-on process. In at least some examples, the gate terminal is pre-charged by controlling circuit components to form circuit arrangements suitable for transferring charge to the gate terminal. For example, a third control signal may be provided to a switch to cause the switch to couple the gate terminal to the power source to cause charge to transfer from the power source to the gate terminal, pre-charging a gate capacitance of the power transistor. As the gate capacitance of the power transistor pre-charges, Vgs of the power transistor increases. Responsive to Vgs of the power transistor exceeding Vth for the power transistor, the power transistor becomes conductive and conducts current between its drain and source terminals. The power transistor may remain conductive until Vgs no longer equals or exceeds Vth for the power converter.

At operation 506, the gate terminal of the power transistor is charged in a second stage of the two-stage turn-on process. In at least some examples, the second stage of the two-stage turn-on process begins responsive to a determination that the pre-charging of operation 504 has caused the gate terminal of the power transistor to be charged to a value of at least Vth of the power transistor. In some examples, the determination is made based on a replica transistor of the power transistor.

In at least some examples, the gate terminal of the power transistor is charged in the second stage by controlling circuit components to form second circuit arrangements suitable for charging the gate terminal. For example, a fourth control signal may be provided to the driver to cause the driver to couple the bottom plate of the bootstrap capacitor to the power source. A second control signal may be provided to a switch to cause the switch to couple the top plate of the bootstrap capacitor to the gate terminal. The gate terminal may be provided with a signal having a value of approximately two times a voltage provided by the power source (assuming that the bootstrap capacitor was charged at operation 502 to approximately the voltage provided by the power source). The second stage of the two-stage turn-on process may be a fast turn-on stage because the gate terminal is provided with a signal having a value at least double that of a signal that may be provided at a source terminal of the power transistor.

By pre-charging the gate terminal, in at least some examples, some current flows through the power transistor prior to the fast turn-on stage. Such current may flow through the power transistor at a slower rate than during the fast turn-on stage. The current that flows through the power transistor during the pre-charging may slowly charge parasitic capacitances of the power converter. By slowly charging the parasitic capacitances of the power converter during the pre-charge stage, ringing in the power converter is reduced compared to implementations that do not include the pre-charge stage. Similarly, by pre-charging the gate terminal prior to charging the gate terminal from the bootstrap capacitor, the bootstrap capacitor may be reduced in size, as described above, when compared to implementations that do not include the pre-charge stage.

While the operations of the method 500 described herein have been described and labeled with numerical reference, in various examples, the method 500 includes operations that are not recited herein. In some examples, any one or more of the operations recited herein include one or more sub-operations. In some examples, any one or more of the operations recited herein is omitted. In some examples, any one or more of the operations recited herein is performed in an order other than that presented herein (e.g., in a reverse order, substantially simultaneously, overlapping, etc.). Each of these alternatives falls within the scope of this description.

In this description, the term "couple" may cover connections, communications, or signal paths that enable a functional relationship consistent with this description. For example, if device A provides a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may be multiple resistors or capacitors, respectively, coupled in series or in parallel between the same two nodes as the single resistor or capacitor.

Uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described examples, and other examples are possible, within the scope of the claims.

What is claimed is:

1. An apparatus, comprising:
   a driver having a driver output;
   a capacitor having first and second capacitor terminals, wherein the first capacitor terminal is directly connected to the driver output;
   a transistor having first and second current terminals and a control terminal;
   a first switch coupled between the second capacitor terminal and the control terminal;
   a second switch coupled between the second capacitor terminal and the first current terminal; and
   a third switch coupled between the control terminal and the first current terminal.

2. The apparatus of claim 1, further comprising:
   a voltage sense circuit having a sense circuit input and a sense circuit output, wherein the sense circuit input is coupled to the control terminal;
   wherein the driver has first and second driver inputs, wherein the first driver input is coupled to a controller output, and the second driver input is coupled to the sense circuit output.

3. The apparatus of claim 2, wherein the voltage sense circuit includes a resistor and a replica transistor, the replica transistor having a replica control terminal and first and second replica current terminals, wherein the replica control terminal is coupled to the control terminal, the first replica current terminal is coupled to the second driver input and coupled to the first current terminal through a resistor, and the second replica current terminal is coupled to a ground terminal.

4. The apparatus of claim 2, further comprising a fourth switch coupled between the sense circuit input and the second current terminal.

5. The apparatus of claim 1, wherein the driver has a driver voltage input and driver ground input, and the driver voltage input is coupled to the first current terminal, and the driver ground input is coupled to a ground terminal.

6. The apparatus of claim 1, wherein the first current terminal is coupled to a power source.

7. The apparatus of claim 1, wherein the transistor is a first transistor, the apparatus further comprising a second transistor having a second control terminal and third and fourth current terminals, wherein the third current terminal is coupled to the second current terminal, and the fourth current terminal is coupled to a ground terminal.

8. The apparatus of claim 1, wherein the apparatus is coupled to an inductor at the second current terminal.

9. A method, comprising:
controlling a driver and a first switch to form a first circuit arrangement to charge a capacitor from a power source;
controlling a second switch to form a second circuit arrangement to charge a gate capacitance of a transistor from the power source, pre-charging the transistor; and
controlling the driver and a third switch to form a third circuit arrangement that includes coupling a top plate of the capacitor to a gate of the transistor to charge the gate capacitance of the transistor.

10. The method of claim 9, wherein controlling the driver to form the third circuit arrangement includes coupling a bottom plate of the capacitor to the power source.

11. The method of claim 9, wherein the second circuit arrangement provides for a first state of a two-stage turn-on process for the transistor, and wherein the third circuit arrangement provides for a second state of the two-stage turn-on process, wherein the second state is a fast turn-on state.

12. The method of claim 9, wherein controlling the driver and the third switch to form the third circuit arrangement is performed responsive to determining that a voltage at the gate of the transistor is greater than a threshold voltage of the transistor.

13. The method of claim 12, wherein determining that the voltage at the gate of the transistor is greater than the threshold voltage of the transistor is performed using a replica transistor that replicates the transistor and has a replica transistor gate coupled to the gate of the transistor.

14. A system, comprising:
a load; and
a switched mode power supply (SMPS) configured to switch power from a power source to the load, the SMPS including:
a driver having a driver output;
a capacitor having first and second capacitor terminals, wherein the first capacitor terminal is directly connected to the driver output;
a transistor having first and second current terminals and a control terminal;
a first switch coupled between the second capacitor terminal and the control terminal;
a second switch coupled between the second capacitor terminal and the first current terminal; and
a third switch coupled between the control terminal and the first current terminal.

15. The system of claim 14, wherein the SMPS includes:
a voltage sense circuit having a sense circuit input and a sense circuit output, wherein the sense circuit input is coupled to the control terminal;
wherein the driver has first and second driver inputs, the a first driver input is coupled to a controller output, and the second driver input is coupled to the sense circuit output; and
a fourth switch coupled between the sense circuit input and the second current terminal.

16. The system of claim 15, wherein the driver has a driver voltage input and a driver ground input, the driver voltage input is coupled to the first current terminal, and the driver ground input is coupled to a ground terminal.

17. The system of claim 15, wherein the driver and the first switch are configured to be controlled to form a first circuit arrangement to charge the capacitor from a power source, wherein the second switch is configured to be controlled to form a second circuit arrangement to charge a capacitance at the control terminal from the power source to pre-charge the transistor; and wherein the driver, and the third switch are configured to be controlled to form a third circuit arrangement that includes coupling the first capacitor terminal to the control terminal, and the second capacitor terminal to the power source.

18. The system of claim 17, wherein controlling the driver and the third switch to form the third circuit arrangement is performed responsive to determining that a voltage at the control terminal is greater than a threshold voltage of the transistor.

19. The system of claim 18, wherein the voltage sense circuit includes a resistor and a replica transistor, the replica transistor having a replica control terminal and first and second replica current terminals, wherein the replica control terminal is coupled to the control terminal, the first replica current terminal is coupled to the second driver input and coupled to the first current terminal through a resistor, and the second replica current terminal is coupled to a ground terminal, and wherein determining that the voltage at the control terminal is greater than the threshold voltage of the transistor is performed based on conductivity of the replica transistor.

20. The system of claim 14, wherein the SMPS is coupled at the second current terminal to the load via an inductor.

* * * * *